（12）United States Patent
Hammerschmied et al.

(10) Patent No.: US 11,336,039 B2
(45) Date of Patent: May 17, 2022

(54) CONNECTOR FOR PRINTED CIRCUIT BOARD AND BATTERY SYSTEM COMPRISING PRINTED CIRCUIT BOARD AND CONNECTOR

(71) Applicant: Samsung SDI Co., Ltd., Yongin-si (KR)

(72) Inventors: Helmut Hammerschmied, Graz (AT); Maximilian Hofer, Hartberg (AT); Peter Apolloner, Graz (AT)

(73) Assignee: SAMSUNG SDI CO., LTD., Yongin-si (KR)

( * ) Notice: Subject to any disclaimer, the term of this patent is extended or adjusted under 35 U.S.C. 154(b) by 43 days.

(21) Appl. No.: 16/344,698

(22) PCT Filed: Oct. 26, 2017

(86) PCT No.: PCT/KR2017/011882
§ 371 (c)(1),
(2) Date: Apr. 24, 2019

(87) PCT Pub. No.: WO2018/080181
PCT Pub. Date: May 3, 2018

(65) Prior Publication Data
US 2020/0059020 A1 Feb. 20, 2020

(30) Foreign Application Priority Data

Oct. 26, 2016 (EP) ..................................... 16195848
Oct. 25, 2017 (KR) ........................ 10-2017-0139327

(51) Int. Cl.
*H01R 12/55* (2011.01)
*B60R 16/033* (2006.01)
(Continued)

(52) U.S. Cl.
CPC ........... *H01R 12/55* (2013.01); *B60R 16/033* (2013.01); *H01M 10/425* (2013.01);
(Continued)

(58) Field of Classification Search
CPC combination set(s) only.
See application file for complete search history.

(56) References Cited

U.S. PATENT DOCUMENTS 5,876,217 A 3/1999 Ito et al.
8,741,461 B2 * 6/2014 Yoneda ................... H01M 2/30
429/97

(Continued)

FOREIGN PATENT DOCUMENTS

CN 101465504 A 6/2009
CN 201541022 U 8/2010
(Continued)

OTHER PUBLICATIONS

JP5285959B2 (JP'959) (A google English language translation) (Year: 2009).*
(Continued)

*Primary Examiner* — Ula C Ruddock
*Assistant Examiner* — Sarika Gupta
(74) *Attorney, Agent, or Firm* — Lewis Roca Rothgerber Christie LLP (57) ABSTRACT

The present invention relates to a battery system including a battery module configured to include a plurality of rechargeable battery cells, a housing configured to house the battery module, a printed circuit board disposed on the battery module to include a first surface that faces the battery module and a second surface that is opposite to the first surface, and a connector configured to connect the printed circuit board and an external electrical component, wherein the printed circuit board includes a plurality of bent terminal (Continued)

portions disposed on the second surface, and the connector includes a plurality of metal clamps that are respectively connected to the plurality of bent terminal portions of the printed circuit board. In the battery system of the present invention, the connection between the connector and the printed circuit board can be realized without soldering wires.

15 Claims, 5 Drawing Sheets

(51) Int. Cl.

| | | |
|---|---|---|
| *H01M 10/42* | (2006.01) | |
| *H01M 10/48* | (2006.01) | |
| *H01R 13/74* | (2006.01) | |
| *H01R 24/66* | (2011.01) | |
| *H05K 1/18* | (2006.01) | |
| *H01M 50/20* | (2021.01) | |
| *H01M 50/50* | (2021.01) | |
| *B60L 50/64* | (2019.01) | |
| *B60K 6/28* | (2007.10) | |
| *H01R 107/00* | (2006.01) | |

(52) U.S. Cl.
CPC ............ *H01M 10/48* (2013.01); *H01M 50/20* (2021.01); *H01M 50/50* (2021.01); *H01R 13/74* (2013.01); *H01R 24/66* (2013.01); *H05K 1/18* (2013.01); *B60K 6/28* (2013.01); *B60L 50/64* (2019.02); *B60Y 2200/91* (2013.01); *B60Y 2200/92* (2013.01); *B60Y 2400/112* (2013.01); *H01M 2010/4271* (2013.01); *H01M 2220/20* (2013.01); *H01R 2107/00* (2013.01); *H01R 2201/26* (2013.01); *H05K 2201/1031* (2013.01); *H05K 2201/10037* (2013.01)

(56) References Cited

U.S. PATENT DOCUMENTS

| | | |
|---|---|---|
| 2009/0156023 A1 | 6/2009 | Lee et al. |
| 2011/0255250 A1 | 10/2011 | Dinh et al. |
| 2012/0045667 A1 | 2/2012 | Yoneda et al. |
| 2013/0101883 A1* | 4/2013 | Zhao ................. H01M 2/266 429/121 |
| 2013/0288530 A1 | 10/2013 | Zhao |
| 2014/0220810 A1 | 8/2014 | Lappoehn |

FOREIGN PATENT DOCUMENTS

| | | |
|---|---|---|
| CN | 202019494 U | 10/2011 |
| CN | 102376922 A | 3/2012 |
| CN | 103843204 A | 6/2014 |
| CN | 104011901 A | 8/2014 |
| CN | 104081559 A | 10/2014 |
| CN | 104701112 A | 6/2015 |
| EP | 2 421 067 A1 | 2/2012 |
| KR | 10-1997-0068044 A | 10/1997 |
| KR | 10-0952322 B1 | 4/2010 |
| KR | 10-2011-0029194 A | 3/2011 |
| KR | 10-2014-0044900 A | 4/2014 |
| KR | 10-1384636 B1 | 4/2014 |
| KR | 10-2015-0062777 A | 6/2015 |
| KR | 10-2015-0065007 A | 6/2015 |
| KR | 20-2015-0002155 U | 6/2015 |
| KR | 10-2015-0106604 A | 9/2015 |

OTHER PUBLICATIONS

Extended European Search Report for corresponding European Patent Application No. 16195848.3, dated Feb. 1, 2017, 9pp.
Korean Intellectual Property Office Action (Korean only) for corresponding Korean Patent Application No. 10-2017-0139327, dated Apr. 28, 2020, 6 pages.
Korean Notice of Allowance dated Aug. 26, 2020, issued in corresponding Korean Patent Application No. 10-2017-0139327 (5 pages).
Chinese Office action issued in corresponding application No. CN 201780065966.5, dated Jul. 16, 2021, 21 pages.

* cited by examiner

CONNECTOR FOR PRINTED CIRCUIT BOARD AND BATTERY SYSTEM COMPRISING PRINTED CIRCUIT BOARD AND CONNECTOR

CROSS-REFERENCE TO RELATED APPLICATION(S)

This application is a National Phase Patent Application of International Patent Application Number PCT/KR2017/011882, filed on Oct. 26, 2017, which claims priority to European Patent Application No. 16195848.3, filed Oct. 26, 2016, and Korean Patent Application No. 10-2017-0139327, filed Oct. 25, 2017. The entire contents of all of which are incorporated herein by reference.

TECHNICAL FIELD

The present invention relates to a connector for a printed circuit board for connecting a printed circuit board (PCB) to an external electrical component, a battery system including the printed circuit board and the connector, and a vehicle including the battery system.

BACKGROUND ART

Rechargeable batteries are widely used in various devices because they can be repeatedly charged and discharged. Low-capacity rechargeable batteries are used as power sources for small electronic devices such as mobile phones, laptop computers, and camcorders, and high-capacity rechargeable batteries are used as power sources for driving a motor, such as for hybrid vehicles.

Generally, a rechargeable battery includes an electrode assembly that includes a positive electrode, a negative electrode, and a separator interposed between the positive electrode and the negative electrode, a case for accommodating the electrode assembly therein, and an electrode terminal electrically connected to the electrode assembly. The case may be modified to suit the purpose of use and the design of the device, such as having a cylindrical shape or a rectangular shape.

The rechargeable battery is used as a battery module in series and/or in parallel with a plurality of unit cells depending on required energy density. That is, the battery module connects the electrode terminals of a plurality of unit batteries conforming to the required amount of power by connecting electrode terminals of a plurality of battery cells to each other, so as to implement a rechargeable battery.

The battery module may be implemented in either a block or modular manner. In the block manner, each of the battery cells is coupled to a common power collecting structural and a common battery management system, and is disposed within the housing. In the module manner, some of the battery cells are connected to a submodule, and some submodules are connected to each other so as to constitute a module. Accordingly, a high power rechargeable battery for an electric vehicle, a hybrid vehicle, or the like may be implemented by combining at least one battery module. In order to construct a battery system, at least one battery module is equipped with a thermal management system, and is mechanically and electrically integrated to communicate with at least one electrical consumption device such as a circuit or device that consumes power.

A static control method for power output and charging is not enough to dynamically satisfy various electric power demands of various electric consumption devices connected to the battery system. The battery system needs to be implemented to perform continuous information transmission between the battery system and controllers of the electrical consumption devices. This information includes important information such as actual state of charge (SoC) of the battery system, potential electrical performance, charging capability, and internal resistance, as well as actual or predicted power demand and surplus of the consumer.

The battery module may provide a printed circuit board (PCB) including a cell supervision circuit (CSC) for sensing and analyzing such parameters. The PCB may further perform a function of connecting to an electronic control device of the battery system such as a battery management system (BMS) and/or an external device such as a car board net.

In the case of a high capacity battery module including a plurality of interconnected battery cells, a large number of wires may be required inside the PCB to monitor each battery cell and to connect the PCB to the BMS and/or an external device, whereby wire complexity is increased and connected parts are liable to be damaged. In addition, a wiring pattern is typically made of copper (Cu), which is expensive. Moreover, since each wire needs to be individually welded, automatic wiring assembly is not possible.

It is therefore an object of the present invention to provide a battery system including a connector for connecting a PCB to an external connector or a power consumption device, which eliminates or reduces at least some of the above disadvantages.

DISCLOSURE

Technical Problem

The present invention has been made in an effort to provide a battery system including a connector for connecting a PCB to an external connector or a power consumption device, which eliminates or reduces at least some of the above disadvantages.

Technical Solution

According to one aspect of the present invention, it is possible to reduce the cost of using copper wires and to improve stability of connection by providing a connector for connecting an external electrical component that does not require wires with a PCB of a battery system.

According to another aspect of the present invention, it is possible to accomplish easy assembly and automation of an assembly process by providing the connector for connecting the PCB of the battery system with the external electrical component, thereby reducing production time and cost.

An exemplary embodiment of the present invention provides a battery system including a battery module configured to include a plurality of rechargeable battery cells, a housing configured to house the battery module, a printed circuit board disposed on the battery module to include a first surface that faces the battery module and a second surface that is opposite to the first surface, and a connector configured to connect the printed circuit board and an external electrical component, wherein the printed circuit board includes a plurality of bent terminal portions disposed on the second surface, and the connector includes a plurality of metal clamps that are respectively connected to the plurality of bent terminal portions of the printed circuit board. The printed circuit board may be disposed on the battery module, and may include a plurality of terminals for being respectively connected to the battery cells on the first surface of the printed circuit board. Preferably, the printed circuit board may include a plurality of first terminals and second terminals on the first surface to be connected to the first terminals and the second terminals of the battery cells, respectively.

The metal clamps may be arranged to extend along a first direction X. Preferably, each of the metal clamps may include a first subset of the metal clamp having a first position along a second direction Y perpendicular to the first direction, and a second subset of the metal clamp having a second position along the second direction. A difference between the first position and the second position may be set depending on the arrangement of the bent terminal portions on the PCB, and it is preferable to set it considering electrical insulation requirements according to the positions of the clamps as well as the arrangement of the bent terminal portion Preferably, the bent terminal portions and the clamps may be spaced apart from each other to exceed a creeping distance. The creeping distance depends on the applied voltage, but the interval between the first position and the second position may be between 2 mm and 20 mm, more preferably between 4 mm and 10 mm.

The metal clamps may be made of a conductive material such as copper or aluminum. The metal clamps may further include a mixture of conductive materials. Each of the bent terminal portions may be made of a metal sheet of an "L" shape.

Preferably, the connector may further include a clamp carrier that supports the metal clamps and extends in the first direction, and the clamp carrier may be disposed within the housing to include a sealing plate disposed perpendicularly to the clamp carrier and a connector head configured to extend along a surface of the sealing plate opposite the surface on which the clamp carrier extends, and the connector head may be disposed outside the housing.

The housing may have an opening for inserting the clamp carrier into the housing. Preferably, the sealing plate may extend parallel to the sidewalls of the housing, and may be configured to cover the opening when the clamp carrier is inserted into the housing.

The clamp carrier, the sealing plate, and the connector head may be molded with a plastic material. The clamp carrier, the sealing plate, and the connector head may be made of a reinforced plastic material such as a fiber or particle reinforced plastic. It is especially preferred that the component includes polybutylene terephthalate filled with fibers such as glass fibers.

Preferably, the connector head may include a plurality of metal pins, and the metal pins may be electrically connected to the metal clamps, respectively. The metal pins may be arranged along two parallel columns.

Preferably, each of the metal clamps may include a main body and two arms extending from the main body. Each of the two arms may include a straight portion extending from the main body and disposed in parallel with the second direction and a tip extending from the straight portion, and may be bent toward each other to form an angle with respect to the second direction. A gap between the tips of the two arms may be smaller than a distance between the straight portions of the two arms.

Preferably, each of the bent terminal portions may include a flat portion extending parallel to a surface of the PCB and fixed to the printed circuit board, and a protrusion extending perpendicularly to the flat portion. The thickness of the protrusion may be greater than a gap between the two arms of the metal clamp.

The tip of the arm may have a contour that includes a curved portion and a straight portion, and a portion of the main body between the two arms may have a concave shape.

As described in detail, according to another aspect of the present invention, a vehicle including the battery system having the connector is provided. The connector may be connected to an electrical board and/or electrical components of a vehicle, such as a battery management system (BMS). Particularly preferably, the connector may be connected to the vehicle board net for 48 V via the BMS.

Advantageous Effects

According to the embodiment of the present invention, the connector is provided with a plurality of metal clamps to be connected to the bent terminal portions of the printed circuit board, and they are coupled to each other by clamping, so that connection between the connector and the PCB can be realized without wires or soldering, thereby providing a battery system with reduced cost and improved stability.

DESCRIPTION OF THE DRAWINGS

The features of the present invention will become apparent to those skilled in the art from the following detailed description of various embodiments with reference to the drawings.

MODE FOR INVENTION

The present invention will be described more fully hereinafter with reference to the accompanying drawings, in which exemplary embodiments of the invention are shown. The above and other objects, features, and advantages of the present invention will be more apparent from the following detailed description taken in conjunction with the accompanying drawings. In order to clearly describe the present invention, the same reference numerals are given to the same or similar elements throughout the specification.

The terms "first" and "second" are used to describe various constituent elements, but the constituent elements are not limited thereto. The expressions are used only to distinguish one constituent element from another. For example, a first constituent element may be referred to as a second constituent element, and likewise, a second constituent element may be referred to as a first constituent element within a range that does not depart the present invention.

In the drawings, the size may be exaggerated for clarity of various constituent elements. For example, although the size or the thickness is arbitrarily shown in the drawings to clearly illustrate each component, the present invention is not necessarily limited to the illustrated ones.

Spatial expressions such as "below", "under", "on the bottom", "above", "over", and "on the top" are intended to compare the characteristics of one component relative to another component, as shown in the drawings. On the other hand, since a component according to the use or operation of the device can be oriented differently, the spatial representation is not limited to as shown. If the orientation of the device shown in the drawing is reversed, one constituent element described as "below", "under", or "on the bottom" with respect to an opposing constituent element will be oriented "above", "over", or "on the top". Thus, expressions like below and above may include both the up and down directions. In addition, the device will be construed to be disposed in various directions such as to be rotated 90 degrees in another direction.

When a component or layer is referred to as being "on", "connected to", or "coupled to" to another component or layer, there may be one or more components or layers between the components or layers. In addition, when it is described that one component or layer is present between two other components or layers, at least one other intermediate component or layer may also be included between said components or layers.

An electronic or electrical device and/or other associated device or constituent element according to an exemplary embodiment of the present invention may be implemented in hardware, firmware, application specific integrated circuits, software, or a combination of firmware, hardware, and software. For example, various constituent elements of the device may be configured in an integrated circuit (IC) or in an individual IC. In addition, various constituent elements of the device may be implemented on a flexible printed circuit film, a tape carrier package (TCP), a printed circuit board (PCB), or one substrate. Various constituent elements of the device may be executed in at least one processor, and may be executed in at least one computing device, or may be processes or threads that execute computer program instructions and interact with constituent elements of other systems to perform various functions of the device. The computer program instructions may be stored in a computing device using a standard memory device, such as a random access memory (RAM). The computer program instructions may also be stored in a non-volatile computer readable medium, such as a CD-ROM, a flash drive, or the like. In addition, those of ordinary skill in the art to which the present invention belongs may incorporate or integrate functions of various computing devices into a single computing device within the scope of exemplary embodiments of the present invention.

Figure 1:
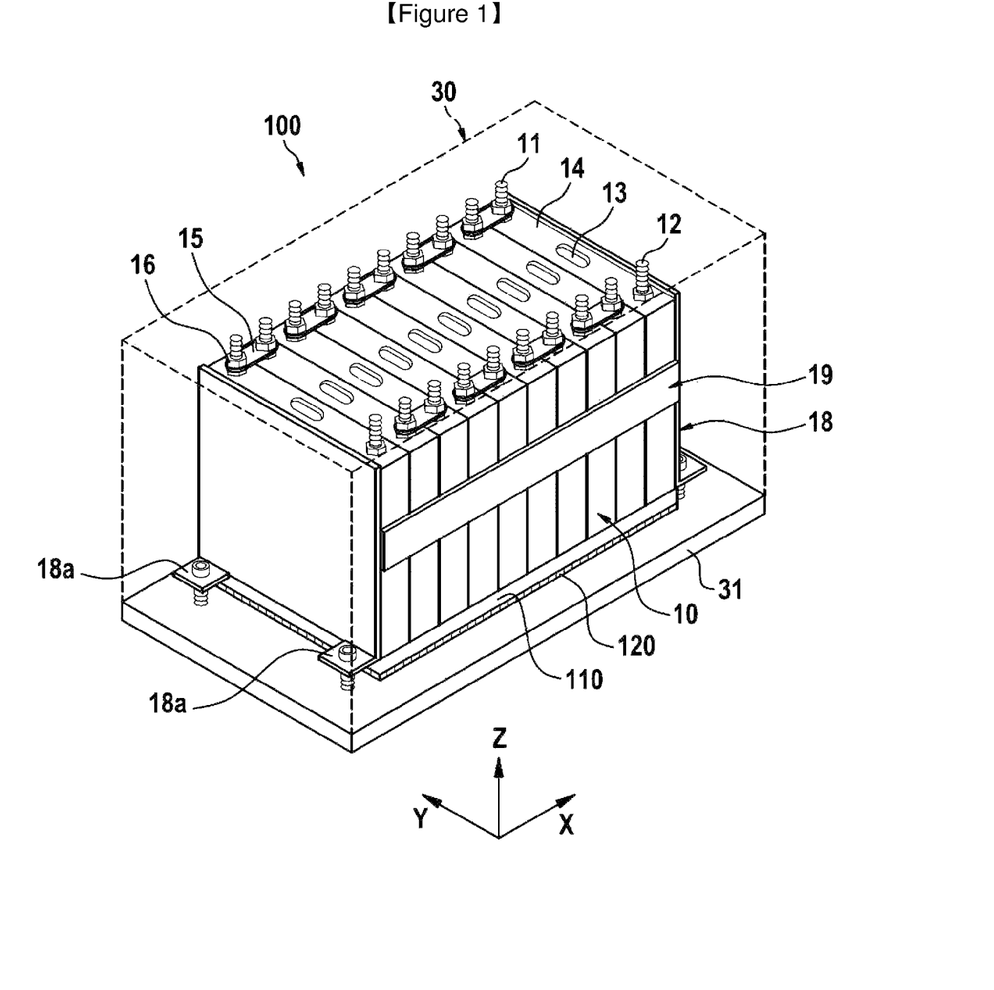
FIG. 1 illustrates a schematic perspective view of a battery module including a plurality of battery cells.

FIG. 1 illustrates a schematic perspective view of a battery module 100. As illustrated in FIG. 1, the battery module 100 includes a plurality of battery cells 10 configured to be aligned in a direction, a pair of end plates 18 configured to respectively face wide surfaces of the battery cells 10 outside of the battery cells 10, and a connection plate 19 configured to fix the battery cells 10 together by connecting the pair of end plates 18 to each other. Fastening portions 18a formed on opposite sides of the battery module 100 are fixed to a support plate 31 by bolts. The support plate 31 is a portion of a housing 30 surrounding the battery cells 10.

Each of the battery cells 10 is an angular (or quadrangular) cell, and the battery module 100 is formed by stacking the cells on top of wide surfaces thereof together. A battery case is closed and sealed by a cap assembly 14. The cap assembly 14 includes a positive terminal 11 and a negative terminal 12 having different polarities, and a vent 13. The vent 13, which is a safety means of each of the battery cell 10, serves as a passage for discharging a gas generated in the battery cell 10 to the outside. A positive terminal 11 and a negative terminal 12 of battery cells 10 adjacent to each other may be electrically connected through a bus bar 15, and the bus bar 15 may be fixed by a fastening means such as a nut 16.

Generally, the battery cells 10 generate a large amount of heat during charging/discharging. The generated heat accumulates in the battery cells 10, accelerating deterioration of the battery cells 10. Accordingly, the battery module 100 may further include a heat exchange member 110 provided adjacent to bottom surfaces of the battery cells 10 so as to cool the battery cells 10. In addition, an elastic member 120 made of rubber or another elastic material may be interposed between the support plate 31 and the heat exchange member 110.

Figure 2:
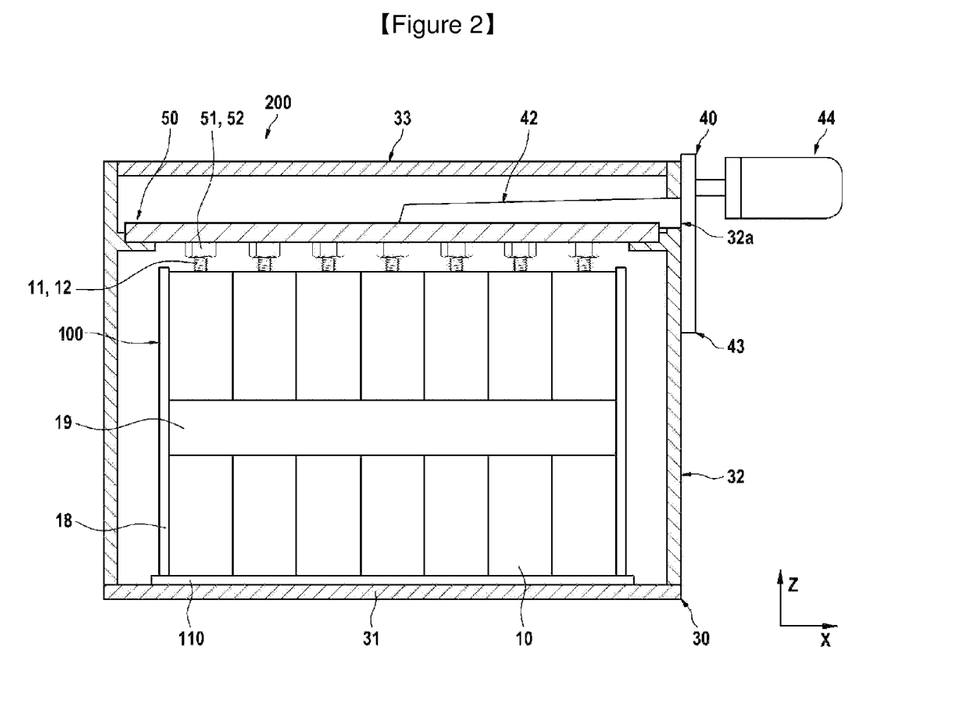
FIG. 2 illustrates a cross-sectional view of a battery system including the battery module illustrated in FIG. 1 and a connector according to an exemplary embodiment of the present invention.

FIG. 2 illustrates a cross-sectional view of a battery system 200 according to an exemplary embodiment of the present invention. The battery system 200 includes a battery module 100, a housing 30 configured to surround the battery module 100, a PCB 50 disposed on the battery module 100, and a connector 40 coupled to the PCB 50. The battery module 100 corresponds to the battery module 100 illustrated in FIG. 1, and thus a detailed description thereof will be omitted.

The battery module 100 is enclosed and housed by the housing 30. The housing 30 includes a support plate 31 disposed on a bottom surface of the battery module 100, and a sidewall 32 configured to extend along an outer side of the support plate 31 surrounding the battery module 100. The housing 30 may further include an upper plate 33 connected to a sidewall 32 so that the battery module 100 is accommodated in an internal space thus constructed. According to the exemplary embodiment of the present invention illustrated in FIG. 2, the PCB 50 is provided inside the housing 30, and is provided between the battery module 100 and the upper plate 33 of the housing 30. The PCB 50 may be a flexible PCB 50. However, the present invention is not limited thereto.

Alternatively, the PCB 50 provided at an upper portion of the battery module 100 may be connected to the sidewall 32, so as to seal the housing 30. In this case, the PCB 50 serves as a top plate of the housing 30, and may be provided as a hard printed circuit board having a protecting function of the battery module 100. A main body of the PCB 50 may be made of a rigid and electrically insulating material such as polyimide (PI) or polyethylene (PET). According to the exemplary embodiment of the present invention, the housing 30 may have a rectangular box shape, but the present invention is not limited thereto.

The PCB 50 includes a plurality of connection terminals 51 and 52 for connecting the battery cells 10 through a lower surface thereof that is disposed to face the battery module 100. A semiconductor element 54 (see FIG. 4) may be disposed on a top surface of the PCB 50. The semiconductor element 54 may include an integrated circuit (IC), and the integrated circuit (IC) may detect and analyze relevant parameters including at least one of a state of charge (SoC), potential electrical performance, temperature, charging capability, and internal resistance of the battery cells, and having parameters depending on other requirements. Particularly preferably, the PCB 50 is configured to be connected to each of the battery cells 10 to determine a voltage of each of the battery cells 10 by using the semiconductor element 54. In addition, the semiconductor element 54 may apply a signal for controlling an operation of the battery cells 10. Particularly, the semiconductor element 54 may control a charging or discharging range through a large current line of the battery cells 10. Furthermore, the semiconductor element 54 may generate a signal indicating the voltage, current, and temperature of the battery cells 10, for example, to prevent overcharge or overdischarge.

To this end, the semiconductor element 54 may transmit information related to the battery cells 10 to an external electronic device through the connector 40, and the external electronic device may include various equipment such as electronic components of a vehicle or the battery system 200. Herein, the information related to the voltage, current, SoC, and temperature of the battery cells 10 may be transferred to the connector 40 and to the semiconductor element 54 through a plurality of bent terminal portions 53 (see FIG. 4 and FIG. 5) positioned on an upper surface of the PCB 50, opposite to a surface of the PCB 50 which faces the battery module 100. The bent terminal portion 53 may be made of a metal sheet that is bent in an L shape, and may include a flat portion 53a extending parallel to the surface of the PCB 50 and a protrusion 53b extending perpendicularly to the flat portion 53a. The flat portion 53a is fixed to the surface of the PCB 50 by soldering or the like. The protrusion 53b has a height that is in a range of 4 mm to 10 mm (extending in a Z direction) and a length that is in a range of 4 mm to 10 mm (extending in a Y direction). In addition, the thickness of the bent terminal portions 53 may be in a range of 4 mm to 10 mm.

Figure 3:
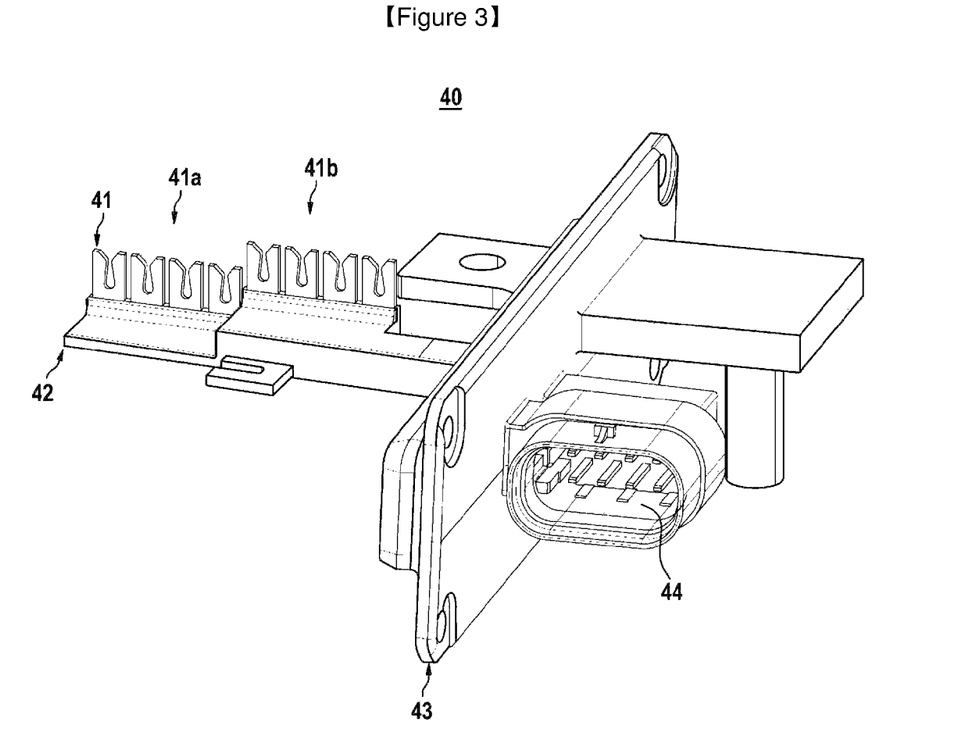
FIG. 3 illustrates a perspective view of a connector according to an exemplary embodiment of the present invention.
Figure 4:
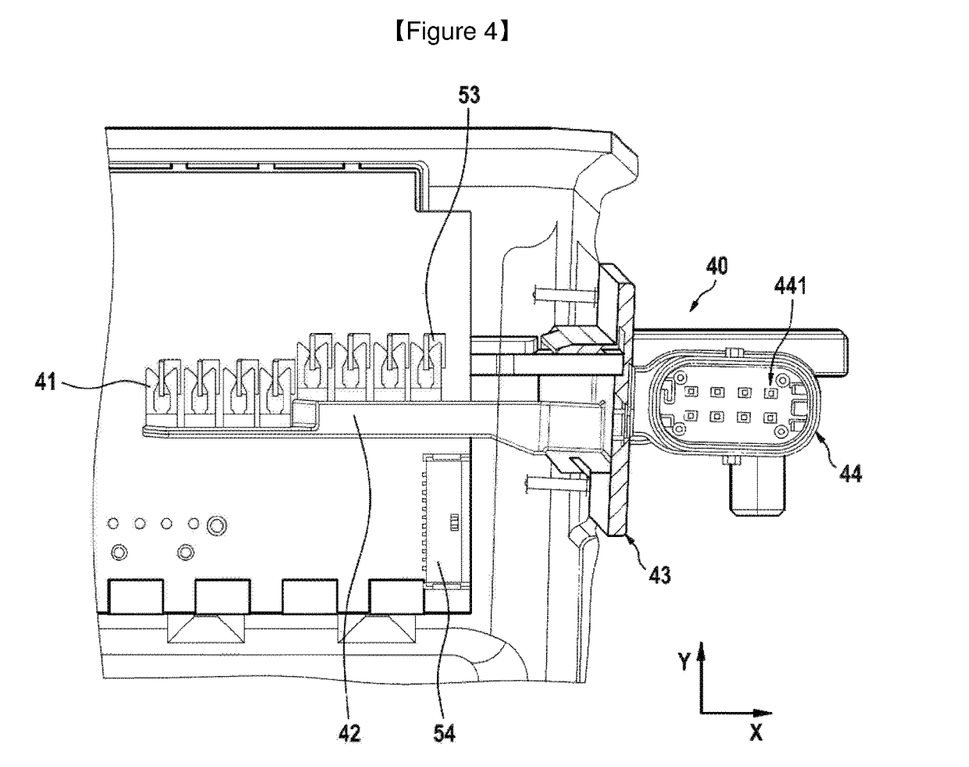
FIG. 4 illustrates a top plan view of a battery system including the connector illustrated in FIG. 2.
Figure 5:
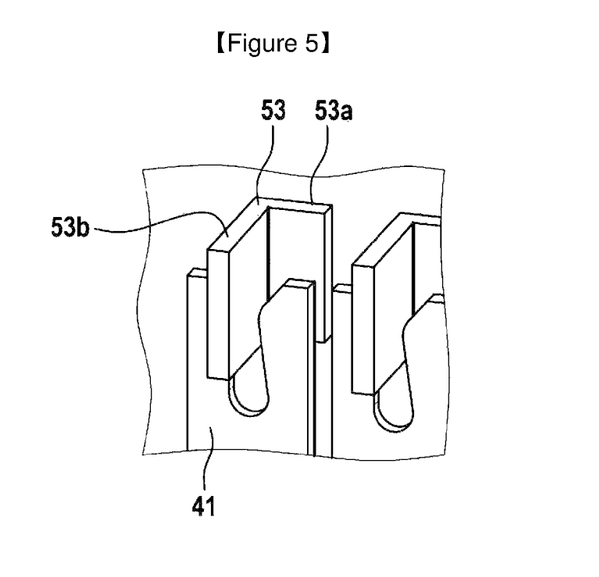
FIG. 5 illustrates a detailed enlarged perspective view of a metal clamp coupled to a bent terminal portion illustrated in FIG. 4.

FIG. 3 illustrates a perspective view of the connector 40 according to an exemplary embodiment of the present invention, FIG. 4 illustrates a top plan view of the battery system 200 of FIG. 2 and the connector 40 of FIG. 3, and FIG. 5 illustrates an enlarged perspective view of a metal clamp 41 coupled to the bent terminal portion 53.

Referring to FIG. 3 and FIG. 4, the connector 40 includes a plurality of metal clamps 41, a clamp carrier 42, a sealing plate 43, and a connector head 44. The metal clamp 41 is designed to be connected to the bent terminal portions 53 of the PCB 50 so as to transfer signals from the PCB 50 to the connector head 44 and from the connector head 44 to the PCB 50, and the connector head 44 is configured to be connected to an external electronic device.

The metal clamps 41 are arranged by extending along the first direction X. Each of the metal clamps 41 has a substantially rectangular shape, and is made of a metal sheet to have a width that is parallel to the first direction X and a height Hc that extends along the second direction Y perpendicular to the first direction X. Each of the metal clamps 41 includes two subsets 41a and 41b, and the first subset 41a and the second subset 41b are disposed at different positions along the second direction Y. That is, the first subset 41a and the second subset 41b are spaced apart from each other along the second direction Y. As a result, collision of the stamping grids may be avoided. The metal clamps 41 are formed corresponding to the bent terminal portions 53 of the PCB 50, respectively.

The clamp carrier 42 extends in a bar shape along the first direction X to support the metal clamps 41. The sealing plate 43 is a flat portion extending vertically in a plane with respect to the first direction X. The clamp carrier 42 extends from the first side of the sealing plate 43 facing the battery module 100. The connector head 44 extends from a second surface of the sealing plate 43 in a direction away from the battery module 100. The clamp carrier 42, the sealing plate 43, and the connector head 44 may be molded integrally with a plastic material, such as polybutylene terephthalate, and are filled with a fiber such as a glass fiber.

According to the exemplary embodiment of the present invention, a frame geometry of the connector 40 is a structure in which two constituent elements are overmolded together, and the first constituent element includes the connector head 44 and a metal pin 441 while the second constituent element includes the clamp carrier 42 at the other end of the sealing plate 43. The connector 40 may include other constituent elements, such as metal bolts for flowing a large current.

The connector head 44 includes a plurality of metal pins 441, and each of the metal pins 441 is electrically connected to a corresponding metal clamp 41. The metal pins 441 are disposed depending on positions of the bent terminal portion 53 on the PCB 50. In general, the metal pins 441 may be disposed at any positions depending on a particular connector requirement. In the present exemplary embodiment, the metal pins 441 are arranged along two columns. The electrical connection between the metal clamps 41 and the metal pins 441 is made by a stamping grid embedded in the connector 40. The connector head 44 is an electrical socket that can be substantially fastened to an external electrical device.

As illustrated in FIG. 4, the connector 40 may be easily coupled to the PCB 50 thanks to a fastening structure of the metal clamps 41, which will be described later in detail. The bent terminal portions 53 of the PCB 50 are disposed on the surface of the PCB 50 facing the battery module 100. The bent terminal portions 53 may be soldered to the surface of the PCB 50. The clamp carrier 42 is first inserted horizontally into the housing 30 through an opening 32a provided in one sidewall 32 for the connection between the PCB 50 and the connector 40. The connector 40 may be fixed to the sidewall 32 of the housing 30, for example, by screwing the sealing plate 43 to the sidewall 32. The connector 40 may be hot stamped to a PCB bracket (not illustrated) that is configured to accommodate the PCB 50 therein. A bonding method or an injection molding method may be applied as other fixing methods.

After the connector 40 is fixed to the housing 30 and the PCB bracket, the PCB 50 is inserted into the housing 30 along the vertical direction (the Z direction in FIG. 2), and the bent terminal portions 53 are respectively fastened to the metal clamps 41. In this way, the PCB 50 may be easily electrically connected to the connector 40. As a result, the PCB 50 and connector 40 may be mounted in simple linear positioning and the assembly process may be automated, thus reducing a production time. Furthermore, since no wire is required between the PCB 50 and the connector 40, the reliability of connection may be improved.

Figure 6A:
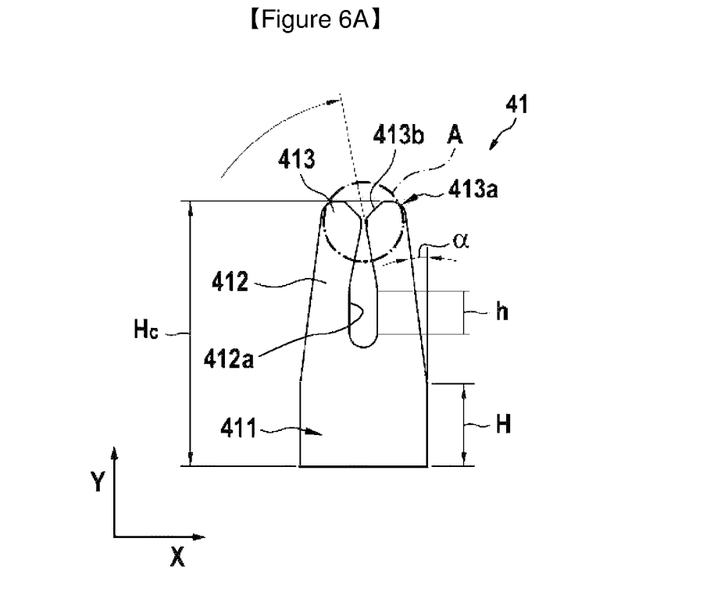
FIG. 6A illustrates a schematic view of a structure of a metal clamp according to an exemplary embodiment of the present invention.
Figure 6B:
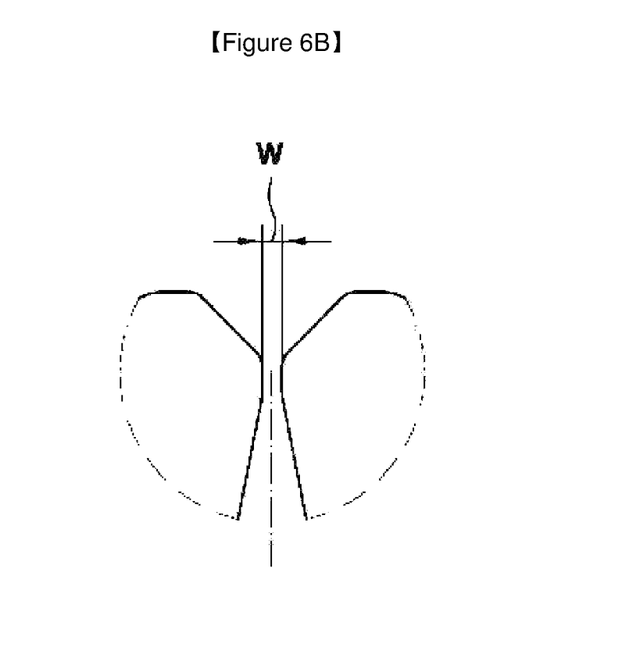
FIG. 6B illustrates an enlarged view of a region A illustrated in FIG. 6A.

FIG. 6A illustrates a schematic view of the metal clamp 41 according to an exemplary embodiment of the present invention, and FIG. 6B illustrates an enlarged view of a region A illustrated in FIG. 6A.

The metal clamps 41 are made of a metal sheet, and thus are substantially flat in parallel with the upper surface of the PCB 50. The metal clamps 41 may be made of a conductive material having an elastic characteristic such as aluminum or copper. Further, the metal clamps 41 may be made of lead depending on the use.

Each of the metal clamps 41 is substantially U-shaped, and includes a main body 411 attached to the clamp carrier 42 and two arms 412 extending from the main body 411 along the second direction Y. A width of the main body 411 may be in a range of 5 mm to 10 mm, and a height H of the main body 411 may be in a range of 4 mm to 8 mm. A height h of the arm 412 may be in a range of 4 mm to 10 mm, and an entire height Hc of the metal clamp 41 may be in a range of 15 mm to 22 mm.

Each of the two arms 412 includes a straight portion 412a extending from the main body 411 and a tip 413 extending from the straight portion 412a, which are bent toward each other to form an angle α with respect to the second direction Y. Accordingly, a gap W formed between the tips 413 of the two arms 412 extending in the direction away from the main body 411 is smaller than a distance between the straight portions 412a of the two arms 412. The gap W may be in a range of 0.2 mm to 0.6 mm. The thickness of the metal clamps 41 may be in a range of 0.5 mm to 1.5 mm, and may preferably be in a range of 0.3 mm to 1.0 mm.

When the pressure is applied to the inside of the tip 413, the two arms 412 may be moved away from each other to enlarge the gap, because the metal clamp 41 is made of a material having an elastic characteristic, whereby the terminal portion 53 may be inserted through the gap.

A thickness of the bent terminal portions 53 of the PCB 50 is larger than the gap W formed between the tips 413, and when the arm 412 returns to an original position, the bent terminal portions 53 stably fit between the two arms 412 of the metal clamps 41. According to an exemplary embodiment of the present invention, each of the tips 413 of the arms 412 has a contour including a curved portion 413a and a straight portion 413b. A portion of the main body 411 formed between the two arms 412 may have a concave shape. As illustrated in FIG. 6A and FIG. 6B, the bent terminal portions 53 of the PCB 50 and the metal clamps 41 of the connector 40 provide smooth and stable fastening to each other. Moreover, depending on the structure of the metal clamps 41 and the bent terminal portions 53 of the PCB 50, the configuration may allow a connection tolerance of up to 2 mm in the vertical direction. Thus, a connector having a connection characteristic that results in simple assembly and improved stability is formed.

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

10: battery cell
100: battery module
200: battery system
30: housing
31: support plate
32: sidewall
32a: opening
33: upper plate
40: connector
41: metal clamp
411: main body
412: arm
413: tip
413a: a curved portion
413b: straight portion
41a, 41b: first and second subset
42: clamp carrier
43: sealing plate
44: connector head
441: metal pin
50: printed circuit board
51, 52: connection terminal
53: bent terminal portion
53a: flat portion
53b: protrusion
54: semiconductor element

The invention claimed is:

1. A battery system comprising:
a battery module configured to include a plurality of rechargeable battery cells;
a housing configured to house the battery module;
a printed circuit board disposed on the battery module and in the housing, the printed circuit board including a first surface that faces the battery module and a second surface that is opposite to the first surface; and
a connector extending through an opening in the housing to connect the printed circuit board and an external electrical component,
wherein the printed circuit board comprises a plurality of bent terminal portions disposed on the second surface, and the connector comprises a plurality of metal clamps that are respectively connected to the plurality of bent terminal portions of the printed circuit board in the housing.

2. The battery system of claim 1, wherein the metal clamps are arranged in rows to extend along a first direction.

3. The battery system of claim 2, wherein
each of the metal clamps comprises a first subset having a first position along a second direction that is perpendicular to the first direction and a second subset having a second position along the second direction, and
the first position is different from the second position.

4. The battery system of claim 1, wherein the metal clamps are made of a conductive material.

5. The battery system of claim 1, wherein each of the bent terminal portions is made of a metal sheet with an "L" shape.

6. The battery system of claim 2, wherein the connector further comprises:
a clamp carrier configured to support the metal clamps and to extend along the first direction to be disposed within the housing;
a sealing plate disposed perpendicularly to the clamp carrier; and
a connector head configured to extend from a surface of the sealing plate opposite to a surface of the sealing plate on which the clamp carrier extends,
wherein the connector head is disposed outside the housing.

7. The battery system of claim 6, wherein
the housing is configured to have an opening for inserting the clamp carrier into the housing, and
the sealing plate covers the opening.

8. The battery system of claim 6, wherein the clamp carrier, the sealing plate, and the connector head are molded with a plastic material.

9. The battery system of claim 6, wherein the connector head comprises a plurality of metal pins electrically connected to the metal clamps, respectively.

10. The battery system of claim 2, wherein each of the metal clamps comprises a main body and two arms extending from the main body along a second direction perpendicular to the first direction.

11. The battery system of claim 10, wherein
each of the two arms comprises a straight portion extending from the main body and disposed in parallel with the second direction and a tip extending from the straight portion, and bent toward each other to form an angle with respect to the second direction, and
a gap between the tips of the two arms is smaller than a distance between the straight portions of the two arms.

12. The battery system of claim 11, wherein
each of the bent terminal portions of the printed circuit board comprises a flat portion extending parallel to a surface of the printed circuit board and fixed to the printed circuit board and a protrusion extending perpendicularly to the flat portion, and
in a first state before the protrusion is inserted between the two arms, a thickness of the protrusion is greater than the gap between the two arms of a corresponding one of the metal clamps, and
in a second state after the protrusion is inserted between the two arms, the two arms elastically deform to retain the protrusion in the clap.

13. The battery system of claim 1, wherein
the printed circuit board further comprises a plurality of connection terminals for electrically connecting each of the battery cells to the printed circuit board, and
the printed circuit board is configured to detect a voltage of each of the battery cells.

14. A vehicle comprising the battery system according to claim 1.

15. The vehicle of claim 14, wherein a connector head of the connector is electrically connected to an electrical board net.

* * * * *